(12) United States Patent
Kato et al.

(10) Patent No.: US 9,040,845 B2
(45) Date of Patent: May 26, 2015

(54) SHIELDING STRUCTURE FOR WIRE HARNESS

(75) Inventors: Hajime Kato, Makinohara (JP); Masahiro Tanaka, Makinohara (JP)

(73) Assignee: Yazaki Corporation, Tokyo (JP)

( * ) Notice: Subject to any disclaimer, the term of this patent is extended or adjusted under 35 U.S.C. 154(b) by 1 day.

(21) Appl. No.: 13/993,404

(22) PCT Filed: Dec. 27, 2011

(86) PCT No.: PCT/JP2011/080302
§ 371 (c)(1),
(2), (4) Date: Jun. 12, 2013

(87) PCT Pub. No.: WO2012/091053
PCT Pub. Date: May 7, 2012

(65) Prior Publication Data
US 2013/0299229 A1    Nov. 14, 2013

(30) Foreign Application Priority Data

Dec. 27, 2010  (JP) ................................ 2010-290407
Nov. 21, 2011  (JP) ................................ 2011-254136

(51) Int. Cl.
*H01R 13/648*  (2006.01)
*H02G 3/04*    (2006.01)
(Continued)

(52) U.S. Cl.
CPC ............... *H02G 3/04* (2013.01); *H02G 15/02* (2013.01); *H05K 9/0007* (2013.01); *H01R 13/5208* (2013.01); *H01R 13/6599* (2013.01); *H05K 9/0018* (2013.01); *B60R 16/0215* (2013.01)

(58) Field of Classification Search
USPC .................................................. 174/359, 659
See application file for complete search history.

(56) References Cited

U.S. PATENT DOCUMENTS 5,171,938 A      12/1992  Katsumata et al.
6,359,224 B1 *   3/2002   Beele ............................ 174/665
(Continued)

FOREIGN PATENT DOCUMENTS

CN      1571076 A      1/2005
CN      201000775 Y    1/2008
(Continued)

OTHER PUBLICATIONS

International Search Report dated Feb. 21, 2012 from the International Searching Authority in counterpart application No. PCT/JP2011/080302.
(Continued)

*Primary Examiner* — Hung V Ngo
(74) *Attorney, Agent, or Firm* — Sughrue Mion, PLLC

(57) ABSTRACT

A shielding structure for a wire harness includes a seal member which has a wire through hole that allows the wire to pass therethrough while sealing a circumference of the wire. The wire has a structure where an insulating resin layer is formed on an outer circumference of a conductor, and a predetermined range in a length direction of the conductor is coated with a shield layer formed by resin plating to cover an outer circumferential surface of the insulating resin layer. A terminal portion of the wire is passed through the wire through hole of the seal member to be introduced into the shield wall to a position where the shield layer exists, whereby an inner circumference of the wire through hole is made in close contact with the shield layer to cause the shield layer and the seal member to be electrically conducted with each other.

2 Claims, 15 Drawing Sheets

(51) Int. Cl.
    *H02G 15/02*     (2006.01)
    *H05K 9/00*     (2006.01)
    *H01R 13/52*     (2006.01)
    *H01R 13/6599*     (2011.01)
    *B60R 16/02*     (2006.01)

(56) References Cited

U.S. PATENT DOCUMENTS

| | | | |
|---|---|---|---|
| 6,388,191 | B1 | 5/2002 | Maegawa |
| 6,459,040 | B2 * | 10/2002 | Teunisse et al. .............. 174/654 |
| 2002/0117319 | A1 | 8/2002 | Saito et al. |
| 2002/0121809 | A1 | 9/2002 | Kameyama |
| 2005/0006126 | A1 | 1/2005 | Aisenbrey |

FOREIGN PATENT DOCUMENTS

| | | |
|---|---|---|
| EP | 0 452 942 A2 | 10/1991 |
| EP | 1 055 565 A2 | 11/2000 |
| EP | 1 469 485 A2 | 10/2004 |
| GB | 2 181 607 A | 4/1987 |
| JP | 6259973 U | 4/1987 |
| JP | 2002217566 A | 8/2002 |
| JP | 2002262438 A | 9/2002 |
| JP | 2002281654 A | 9/2002 |
| JP | 2003284223 A | 10/2003 |
| JP | 200860062 A | 3/2008 |

OTHER PUBLICATIONS

Written Opinion dated Feb. 21, 2012 from the International Searching Authority in counterpart application No. PCT/JP2011/080302.
Extended European Search Report dated Apr. 30, 2014 issued by the European Patent Office in counterpart European Patent Application No. 11854463.4.
Extended European Search Report dated Apr. 30, 2014 issued by the European Patent Office in counterpart European Patent Application No. 13004157.7.
Communication from the Japanese Patent Office dated Feb. 24, 2015 in a counterpart Japanese application No. 2010-290407.
Communication from the State Intellectual Property Office of P.R. China dated Feb. 3, 2015, in a counterpart application No. 201180062944.6.

* cited by examiner

SHIELDING STRUCTURE FOR WIRE HARNESS

TECHNICAL FIELD

The present invention relates to a shielding structure in the case where a wire harness is to be introduced into a shield case.

BACKGROUND ART

Conventionally, in the case where terminal portions of wires are to be introduced into a shield case while being shielded, for example, a shield shell 120 is disposed so as to surround connectors 110 disposed on the terminal portions of the wires as shown in FIGS. 13 to 15, a rear end portion of the shield shell 120 is doubly covered by an end portion of a braid 121 which is disposed so as to cover the wires, and the covered portion is crimped and fixed by a ring 123. In this state, a front surface portion of the shield shell 120 is fixed to a shield case 101 in a conduction state, and terminals 112 of the connectors 110 which are introduced into the shield case 101 are connected to a terminal block 102 of the shield case 101. In this case, it is usual to interpose a seal packing 122 between the matching surfaces of the shield case 101 and the shield shell 120, thereby ensuring the sealing property between the shield case 101 and the shield shell 120.

The structure in which shielding is performed as described above is well known in, for example, Patent Document 1 and the like.

CITATION LIST

Patent Document

Patent Document 1: JP-A-2002-281654

SUMMARY OF INVENTION

Technical Problem

In a conventional shielding structure such as that shown FIGS. 13 to 15, components such as the shield shell 120, the braid 121, and the crimping ring 123 are necessary in order to perform shielding, and there is a problem in that the number of components is large.

Moreover, the entire length of a wire from one end to the other end is covered by the single braid 121. In the case where the wire is to be branched along the way and connectors are to be attached to the tip ends of the branched two wires, respectively, therefore, there is also a problem in that the configuration of the braid 121 is so complicated that it is hardly coped with.

In the case where the packing 122 is interposed between the matching surfaces of the shield case 101 and the shield shell 120, it is difficult to enable the shielding effect to sufficiently function in the range of the thickness of the packing 122, and there is a possibility that a shield leakage portion may be formed.

In the portion where the end portion of the braid 121 covers the outer circumference of the rear end portion of the shield shell 120, the density of the braid 121 is low, and hence a countermeasure such as that in which the end portion of the braid 121 is folded back to form a double structure is taken so as to prevent the shielding performance from being lowered. The process of forming the structure is cumbersome. Moreover, the portion where the braid 121 is folded back to form a double braid structure is excessively expanded, and an extra space is sometimes necessary in the periphery.

The invention is conducted in view of the above-discussed circumstances. It is an object of the invention to provide a shielding structure for a wire harness in which the number of components can be reduced, which, even in a situation where a wire is branched along the way, can easily cope with the situation, in which sufficient sealing and shielding performances can be ensured, and which can solve troubles that are caused when a braid is used.

Solution to Problem

The object of the invention can be attained by the following configurations.

(1) A shielding structure for a wire harness in which a wire constituting a wire harness is to be introduced into a shield wall of an electric apparatus while being shielded, comprising:

a seal member which is made of electrically conductive rubber, which has a wire through hole that allows the wire to pass therethrough while sealing a circumference of the wire, and which is to be attached to the shield wall in a closely contacted state, wherein the wire has a structure where an insulating resin layer is formed on an outer circumference of a conductor, and a predetermined range in a length direction of the conductor is coated with a shield layer formed by resin plating to cover an outer circumferential surface of the insulating resin layer, and a terminal portion of the wire is passed through the wire through hole of the seal member to be introduced into the shield wall to a position where the shield layer formed by the resin plating exists, whereby an inner circumference of the wire through hole of the seal member is made in close contact with the shield layer of the wire to cause the shield layer and the seal member made of electrically conductive rubber to be electrically conducted with each other.

(2) The shielding structure for a wire harness according to (1) above wherein, in the terminal portion of the wire introduced into the shield wall, a non-resin plating portion where the resin plating is excluded is ensured in a predetermined range from an end portion of the conductor is ensured, a conductor exposed portion in which the insulating resin layer is excluded is disposed in an end portion of the non-resin plating portion, and a connecting portion is disposed in the conductor exposed portion.

(3) The shielding structure for a wire harness according to (1) or (2) above wherein a plurality of the conductors are covered in a state where the conductors are insulated from each other, by a resin mold portion which is integrally molded, and which functions as the insulating resin layer, a predetermined range in a length direction of the conductors is coated with a shield layer formed by the resin plating to cover an outer circumferential surface of the resin mold portion, the wire through hole that allows the resin mold portion to pass therethrough while sealing a circumference of the resin mold portion that integrally holds the plurality of conductors is disposed in the seal member, and terminal portions of the conductors which are held by the resin mold portion are passed through the wire through hole of the seal member to be introduced into the shield wall to a position where the shield layer formed by the resin plating exists, whereby the inner circumference of the wire through hole of the seal member is made in close contact with the shield layer which covers the outer circumferential surface of the resin mold portion, and the shield layer and the seal member made of electrically conductive rubber are electrically conducted with each other.

(4) A shell fixture structure comprising:

a wire harness in which a circumference of a wire is covered by a shield layer;

a resin mold portion which covers a plurality of conductors in a terminal portion of the wire in a state where the conductors are insulated from each other;

a ring-like shield shell through which the resin mold portion is passed;

a wire terminal-side movement regulating portion which is formed on a side of an outer circumference of the resin mold portion; and a shell-side movement regulating portion which is formed on a side of an inner circumference of the shield shell, wherein the wire terminal-side movement regulating portion and the shell-side movement regulating portion are engaged with each other at a predetermined relative rotation position in a case where the both are relatively rotated about an axis in a state where the shield shell is externally inserted onto the resin mold portion, thereby regulating relative movement of the resin mold portion and the shield shell in an axial direction.

(5) The shell fixture structure according to (4) above, wherein a rotation regulating mechanism which regulates relative rotation of the resin mold portion and the shield shell at the predetermined relative rotation position is disposed between the wire terminal-side movement regulating portion and the shell-side movement regulating portion.

According to the shielding structure for a wire harness having the configuration of (1) above, the wire portion which is exposed to the outside of the shield wall is shielded by the resin plating which is used in place of a braid, and a portion of the wire introduced into the shield wall is shielded by the seal member made of electrically conductive rubber. Therefore, a braid, a shield shell, and a crimping ring are not necessary, and hence the number of components can be reduced.

Moreover, the seal member itself is electrically conductive. Unlike the case where a conventional packing is used, therefore, there is no possibility that a shield leakage portion may be formed, and shielding and sealing performances which are sufficiently high can be provided.

Moreover, resin plating is used in place of a braid. Even in a situation where the wire is branched along the way, therefore, the structure can easily cope with the situation.

Furthermore, a braid is not used, and hence a compact wire harness is obtained which is free from troubles that may be caused in the case where a braid is used, i.e., extra processing such as folding into a double braid, and necessity of an extra space.

According to the shielding structure for a wire harness having the configuration of (2) above, the non-resin plating portion is ensured in the terminal portion of the wire, the conductor exposed portion in which the insulating resin layer is excluded is disposed in the end portion of the non-resin plating portion, and the connecting portion is disposed in the conductor exposed portion. Therefore, the plating layer which is the shield layer, and the connecting portion connected to the conductor can be surely maintained in a non-conductive state.

According to the shielding structure for a wire harness having the configuration of (3) above, the plurality of conductors are covered by the resin mold portion in the state where they are insulated from each other, and the shield layer formed by the resin plating is formed so as to cover the outer circumferential surface of the resin mold portion. Therefore, the plurality of conductors can be integrally shielded while insulating them.

Moreover, the shield layer can be made conductive with the seal member by passing the resin mold portion through the wire through hole of the seal member made of electrically conductive rubber. When the seal member is attached to the shield case so as be in close contact therewith, therefore, both the sealing function and the shielding function can be simultaneously exerted.

According to the shell fixture structure having the configuration of (4) above, the resin mold portion can be passed through a through hole of the shield shell which is formed into a ring-like shape, and hence the shield shell can be externally inserted from any of the front and rear sides of the resin mold portion. When, in the state where the shield shell is externally inserted onto the resin mold portion, the both are then relatively rotated to the predetermined relative rotation position, and the wire terminal-side movement regulating portion and the shell-side movement regulating portion are engaged with each other, relative movement of the resin mold portion and the shield shell in the axial direction is regulated, and the resin mold portion is installed to the shield shell.

Therefore, the installation direction of the resin mold portion with respect to the through hole of the shield shell is not restricted. According to the configuration, the resin mold portion which is integrally molded with the terminal portion of the wire may be passed through the through hole of the shield shell from the side of the terminal portion of the wires. Unlike a conventional shell fixture structure, therefore, a work of previously passing the shield shell through the wire harness is not required.

According to the shell fixture structure having the configuration of (5) above, when, in the state where the shield shell is externally inserted onto the resin mold portion, the both are relatively rotated to the predetermined relative rotation position, and the wire terminal-side movement regulating portion and the shell-side movement regulating portion are engaged with each other to regulate relative movement in the axial direction, relative rotation of the resin mold portion and the shield shell is regulated by the rotation regulating mechanism. With respect to the resin mold portion and the shield shell, therefore, the integrally fixed state where axial movement and relative rotation about the axis are regulated is held, and the fixed state is prevented from being accidentally cancelled.

When the integrally fixed state of the resin mold portion and the shield shell is to be cancelled, a rotational moment of a certain level or higher may be applied against the engagement force of the rotation regulating mechanism, and the resin mold portion and the shield shell may be relatively rotated until the engagement of the wire terminal-side movement regulating portion and the shell-side movement regulating portion is cancelled.

BRIEF DESCRIPTION OF DRAWINGS

FIG. 1A is an exploded perspective view, and FIG. 1B is a perspective view showing an assembled state.

FIG. 8A is a perspective view when a shield portion is viewed from the upper side, and FIG. 8B is a perspective view when the shield portion is viewed from the lower side.

FIG. 9A is a perspective view when the shield portion is viewed from the upper side, and FIG. 9B is a plan view when the shield portion is viewed from the lower side.

DESCRIPTION OF EMBODIMENTS

Hereinafter, embodiments of the invention will be described with reference to the drawings.

First Embodiment

Figure 1A:
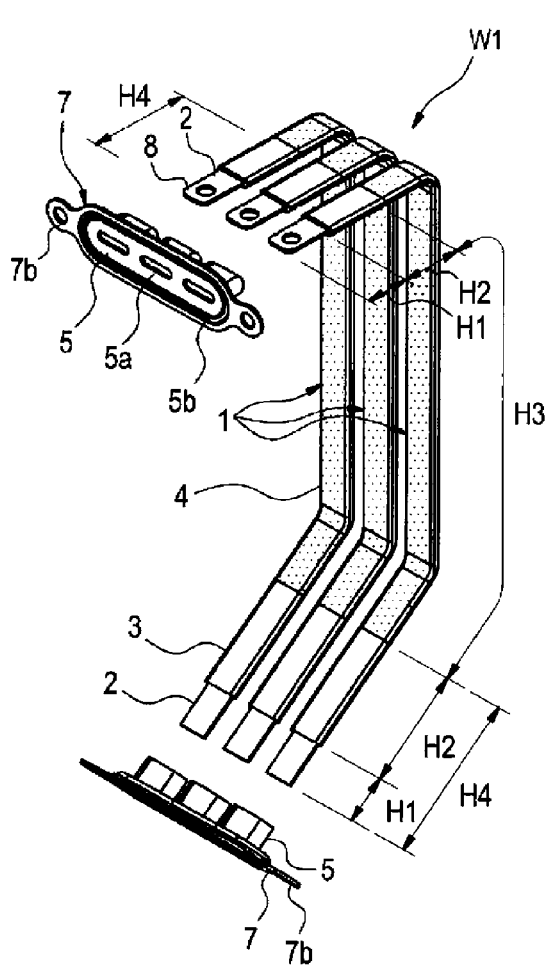
FIGS. 1A and 1B are views illustrating a shielding structure for a wire harness of a first embodiment of the invention.
Figure 1B:
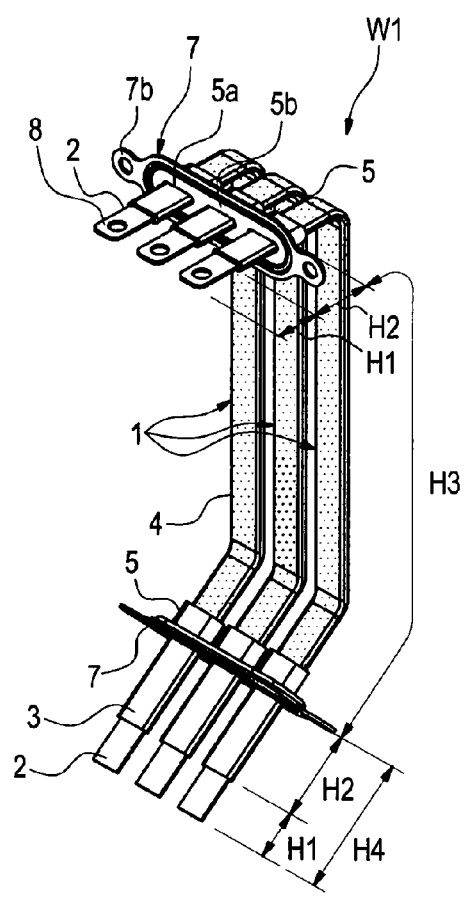
Figure 2:
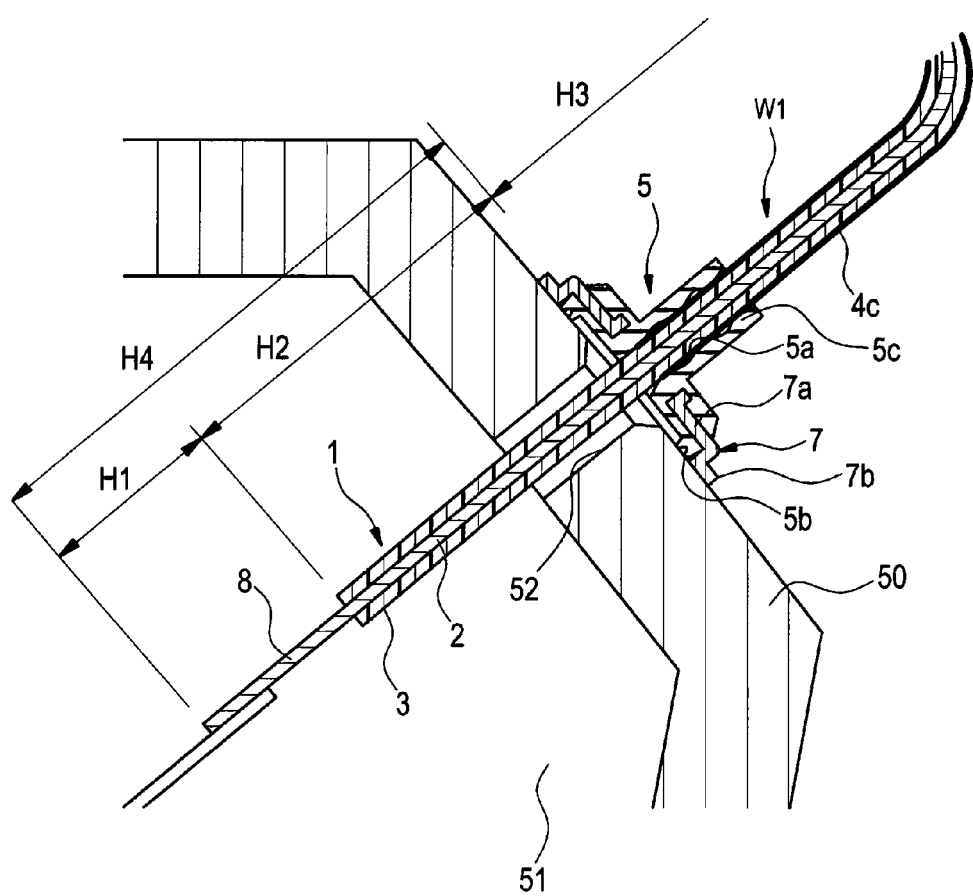
FIG. 2 is a sectional view of a portion where an end portion of the wire harness in the first embodiment is introduced into a shield case.

FIGS. 1A and 1B are views illustrating a shielding structure for a wire harness of a first embodiment, FIG. 1A is an exploded perspective view, FIG. 1B is a perspective view showing an assembled state, and FIG. 2 is a sectional view of a portion where an end portion of the wire harness is introduced into a shield case.

The shielding structure of the first embodiment is a structure in the case where a wire 1 constituting the wire harness W1 is introduced into the interior 51 of a shield wall 50 of an electric apparatus while being shielded and sealed, through an insertion hole 52 formed in the shield wall 50. First, the wire 1 has a structure where an insulating resin layer 3 is formed on the outer circumference of a band plate-like conductor 2, and a predetermined range (the range indicated by H3 in the figure) in the length direction of the conductor 2 is coated with a shield layer 4 formed by resin plating so as to cover the outer circumferential surface of the insulating resin layer 3.

In the embodiment, three band plate-like wires 1 are placed while being arranged in the width direction, and laid in parallel in the same route. In each of the both ends of the three wires 1, a seal member 5 made of electrically conductive rubber, and a metal-made shield shell 7 which is integrated with the seal member 5 when the seal member is molded are disposed.

The shield shell 7 has an elliptical ring-like shape, and is integrated with the seal member 5 by embedding an inner circumferential flange 7a into the rubber forming the seal member 5. An outer circumferential flange 7b having mounting holes is exposed to the outside of the rubber forming the seal member 5. The shield shell 7 is screwed to the shield wall 50 of the electric apparatus while using the mounting holes, whereby the seal member 5 which is disposed in an inner circumferential portion of the shield shell 7 is held to a state where it is in close contact with the shield wall 50.

The seal member 5 is a thick plate member having an elliptical shape, and has three wire passing holes 5a which penetrate in the thickness direction, and through which the wires 1 can be passed while sealing the circumferences of the wires 1, respectively. In this case, the band plate-like wires 1 have a rectangular sectional shape, and therefore the three wire passing holes 5a are formed as rectangular through holes, respectively. In order to enhance the close contact with respect to the shield wall 50, an annular seal lip 5b is disposed on the close contact surface with respect to the shield wall 50.

A terminal portion of each of the wires 1 is passed through the wire passing hole 5a of the seal member 5 to a position where the shield layer 4 formed by the resin plating exists, and an inner circumferential lip 5c of the wire passing hole 5a of the seal member 5 is in close contact with the outer surface of the shield layer 4 of the wire 1. Therefore, the shield layer 4 and the seal member 5 made of electrically conductive rubber are electrically conductive with each other.

When the shield shell 7 is attached to the shield wall 50 of the electric apparatus, and the seal member 5 is made in close contact with the shield wall 50, therefore, it is possible to waterproof seal between the wires 1 and the shield wall 50, and at the same time the shield layers 4 in the outer circumferences of the wires 1 can be made conductive with the shield wall 50 of the electric apparatus to be grounded, through the seal member 5, or through the seal member 5 and the shield shell 7.

In the terminal portion of each of the wires 1 which are introduced into the shield wall 50 in this way, a non-resin plating portion H4 where the resin plating is excluded in a predetermined range from an end portion of the conductor 2 of the wire 1 is ensured, a conductor exposed portion H1 in which the insulating resin layer 3 is excluded is disposed in an end portion of the non-resin plating portion H4, and the conductor exposed portion H1 is formed as a connecting portion 8 having a fastening hole. The range indicated by H2 in the figure is a portion where the insulating resin layer 3 is exposed.

In the case where, as described above, the shield layer 4 formed by resin plating is formed on the outer circumferential surface of the wire 1 in the cable exposed zone (the zone exposed to the outside of the shield wall 50), the shielding effect can be easily provided to the wire without requiring extra space and thickness, unlike the case where a braid is disposed for shielding. Since the seal member 5 made of electrically conductive rubber is interposed between the shield layer 4 of the wire 1 and the shield wall 50 of the electric apparatus, moreover, the shield layer 4 and the shield wall 50 can be easily made conductive with each other simply by causing the wire 1 to pass through the wire passing hole 5a of the seal member 5, and the seal member 5 to be in close contact with the shield wall 50. Therefore, a braid and a crimping ring are not necessary, and hence the number of components can be reduced.

Although the shield shell 7 is used in the embodiment, the seal member 5 made of electrically conductive rubber is sufficient for ensuring the shielding performance. The shield shell 7 is required only to exert the function of causing the seal member 5 to be in close contact with the shield wall 50. Therefore, the shield shell is not always necessary to have the shielding performance, and may be configured by a non-metallic material. In that sense, the shield shell 7 exerting the shielding function may be omitted.

Moreover, the seal member 5 itself is electrically conductive. Unlike the case where a conventional packing is used, therefore, there is no possibility that a shield leakage portion may be formed, and shielding and sealing performances which are sufficiently high can be provided. Moreover, the shield layer 4 formed by the resin plating is used in place of a braid. Even in a situation where the wire 1 is branched along the way, therefore, the structure can easily cope with the situation. Namely, the conductor 2 may be previously formed along the laying route, the insulating resin layer 3 may be then formed, and resin plating may be applied thereon. Therefore, the structure is not affected by the laying mode of the wires 1, and the degree of freedom in layout is enhanced. For example, also a wire harness in which one end side is configured by a single connector, and the other end side has a shielding function for a plurality of connectors can be easily produced.

In the shielding structure of the embodiment, furthermore, a braid is not used, and hence a compact wire harness can be obtained which is free from troubles that may be caused in the case where a braid is used, i.e., extra processing such as folding into a double braid, and necessity of an extra space.

The shield layer 4 formed by the resin plating is only in contact with the inner circumference of the wire passing hole 5a of the seal member 5 made of the electrically conductive rubber, and there is no possibility of breaking a plating layer unlike the case of crimping. Therefore, the shielding performance of the terminal is not impaired.

The non-resin plating portion H4 is ensured in the terminal portion of the wire 1, the conductor exposed portion H1 in which the insulating resin layer 3 is excluded is disposed in the end portion of the non-resin plating portion H4, and the conductor exposed portion H1 is formed as the connecting portion 8 having the fastening hole 8. Therefore, the plating layer which is the shield layer 4, and the connecting portion 8 with respect to the conductor 2 can be surely maintained in a nonconductive state.

In the embodiment, the case where the shield shell 7 and the seal member 5 are integrally formed by insert molding has been described. Alternatively, they are separately molded, and thereafter combined with each other.

Second Embodiment

Figure 3:
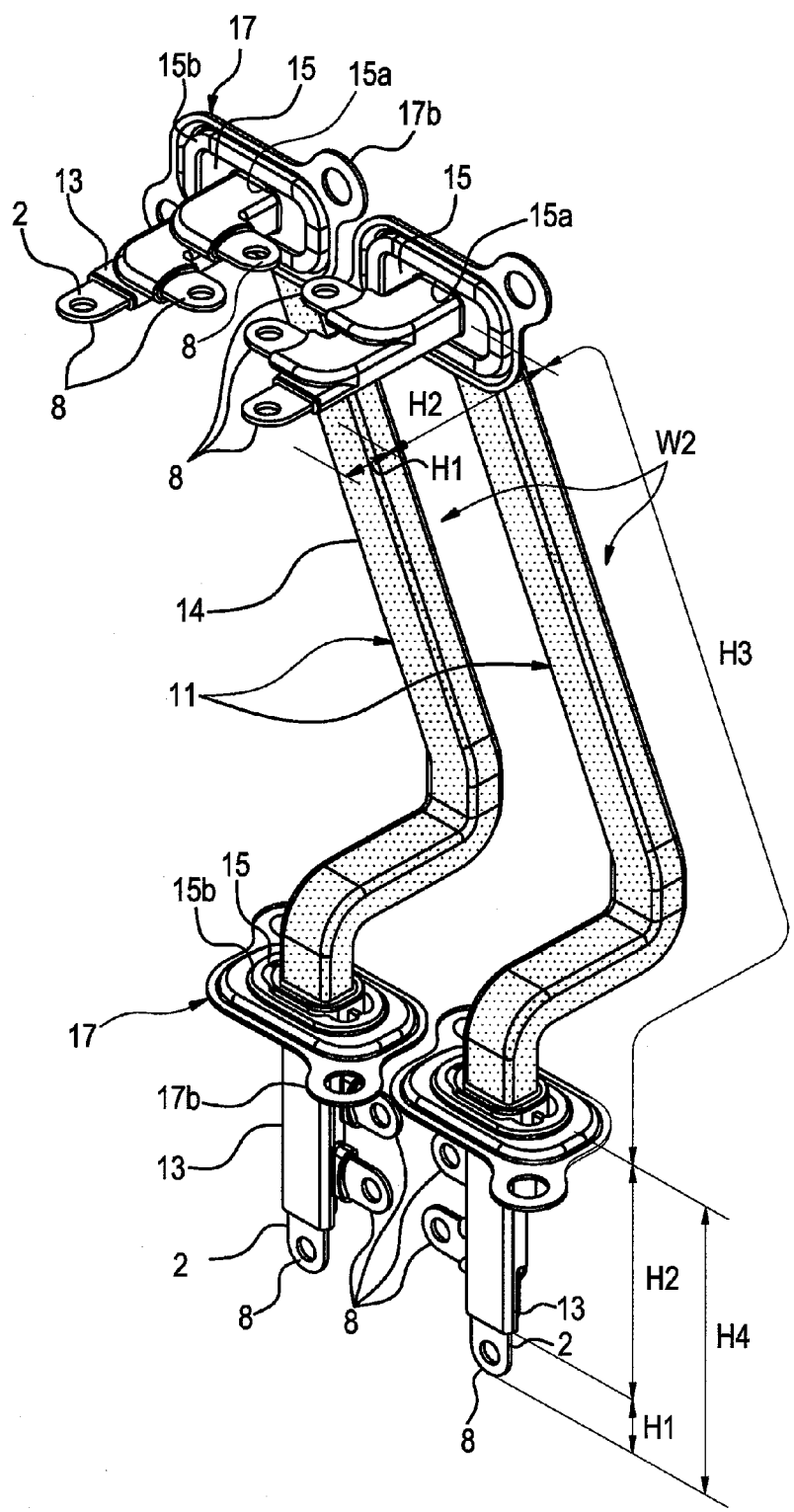
FIG. 3 is a perspective view of a shielding structure for a wire harness of a second embodiment of the invention.
Figure 4:
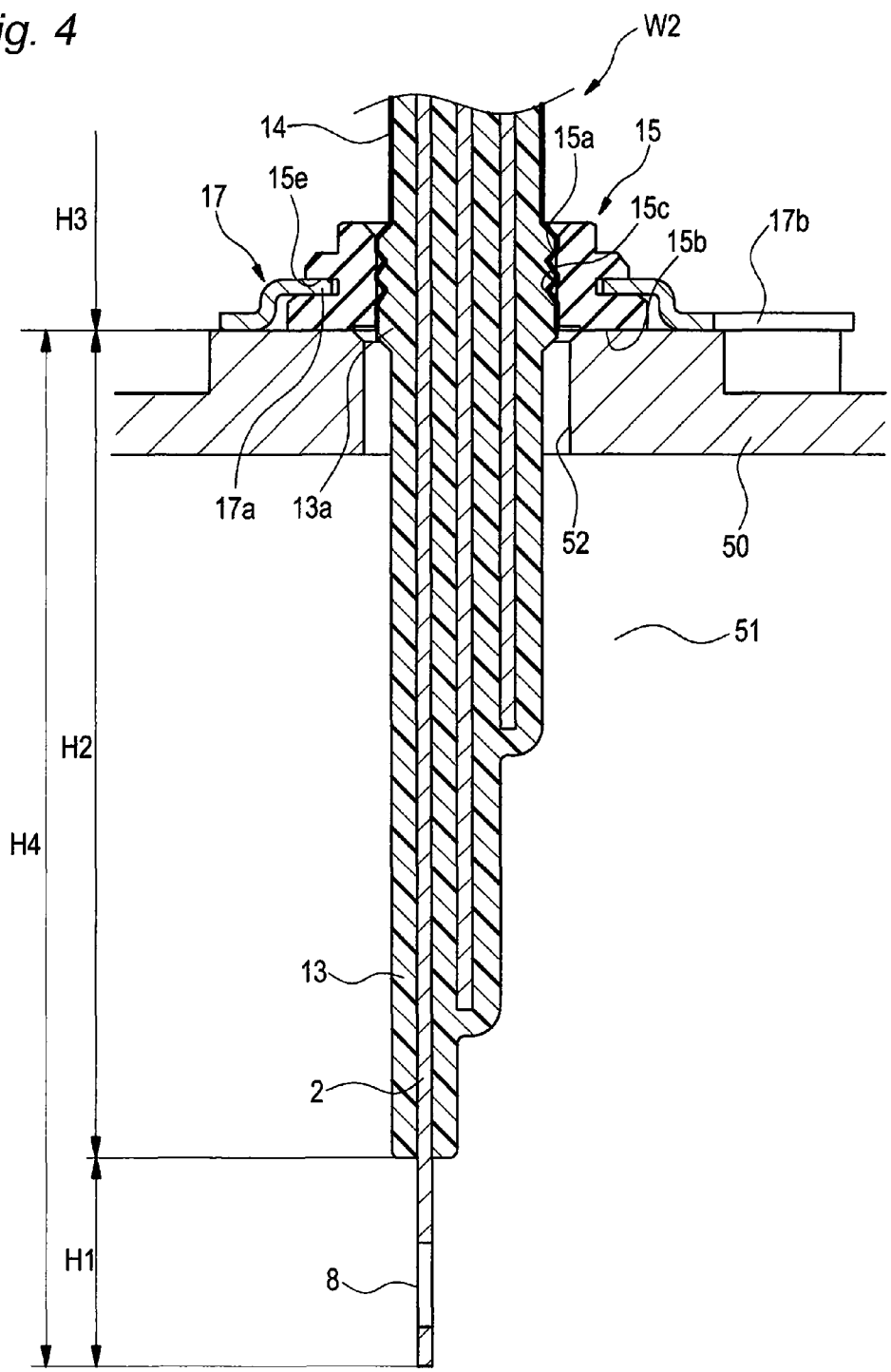
FIG. 4 is a sectional view of a portion where an end portion of the wire harness in the second embodiment is introduced into a shield case.

FIG. 3 is a perspective view of a shielding structure for a wire harness of a second embodiment of the invention, and FIG. 4 is a sectional view of a portion where an end portion of the wire harness is introduced into a shield case.

Each of wires 11 constituting the wire harness W2 in the second embodiment has a structure where three band plate-like conductors 2 are stacked at intervals in the thickness direction and bundled, and covered in a state where the conductors 2 are insulated from each other, by a resin mold portion 13 which functions as an integrally molded insulating resin layer. A predetermined range in the length direction of the conductor 2 is coated with a shield layer 14 formed by resin plating so as to cover the outer circumferential surface of the resin mold portion 13.

In each of the both ends of the wire 11, a seal member 15 made of electrically conductive rubber, and a metal-made shield shell 17 which holds the seal member 15 are disposed. The shield shell 17 has a ring-like shape, and is integrated with the seal member 15 by fitting an inner circumferential flange 17a of the shell into an outer circumferential groove 15e of the seal member 15. An outer circumferential flange 17b having mounting holes is exposed to the outside of the seal member 15. The shield shell 17 is screwed to the shield wall 50 of the electric apparatus while using the mounting holes, whereby the seal member 15 which is disposed in an inner circumferential portion of the shield shell 17 is held to a state where it is in close contact with the shield wall 50.

The seal member 15 is a thick plate member, and has a wire passing hole 15a which penetrates in the thickness direction, and through which the wire 11 can be passed while sealing the circumference of the wire 1. In this case, the wire passing hole 15a is formed into a shape which corresponds to the sectional shape of the resin mold portion 13. In order to enhance the close contact with respect to the shield wall 50, an annular seal lip 15b is disposed on the close contact surface with respect to the shield wall 50.

A terminal portion of the wire 11 in which the resin mold portion 13 is disposed is passed through the wire passing hole 15a of the seal member 15 to a position where the shield layer 14 formed by the resin plating exists, and an inner circumferential lip 15c of the wire passing hole 15a of the seal member 15 is in close contact with the outer surface of the shield layer 14 of the wire 11. Therefore, the shield layer 14 and the seal member 15 made of electrically conductive rubber are electrically conductive with each other.

When the shield shell 17 is attached to the shield wall 50 of the electric apparatus, and the seal member 15 is made in close contact with the shield wall 50, therefore, it is possible to waterproof seal between the wire 11 and the shield wall 50, and at the same time the shield layer 14 in the outer circumference of the wire 11 can be made conductive with the shield wall 50 of the electric apparatus to be grounded, through the seal member 15, or through the seal member 15 and the shield shell 17.

In the terminal portion of the wire 11 which is introduced into the shield wall 50 in this way, a non-resin plating portion H4 where the resin plating is excluded in a predetermined range from an end portion of the conductors 2 of the wire 1 is ensured, a conductor exposed portion H1 in which the resin mold portion (insulating resin layer) 13 is excluded is disposed in an end portion of the non-resin plating portion H4, and the conductor exposed portion H1 is formed as the connecting portion 8 having a fastening hole. In the connecting portion 8, the three conductors 2 are placed while being positionally shifted from each other so as not to overlap in the thickness direction, whereby the conductors are enabled to be coupled by bolts to terminals of the electric apparatus, respectively. The range indicated by H2 in the figure is a portion where the insulating resin layer 13 is exposed.

The shielding structure of the second embodiment can attain the following effects in addition to the effects of the shielding structure of the above-described first embodiment. Since the plurality of the conductors 2 are covered in the state where the conductors are insulated from each other by the resin mold portion 13, and the shield layer 14 formed by the resin plating is formed so as to cover the outer circumferential surface of the resin mold portion 13, the plurality of conductors 2 can be integrally shielded while insulating them. Moreover, the shield layer 14 can be made conductive with the seal member 15 by passing the resin mold portion 13 through the wire through hole 15a of the seal member 15 made of electrically conductive rubber. When the seal member 15 is attached to the shield wall 50 so as be in close contact therewith, therefore, both the sealing function and the shielding function can be simultaneously exerted.

Third Embodiment

Figure 5:
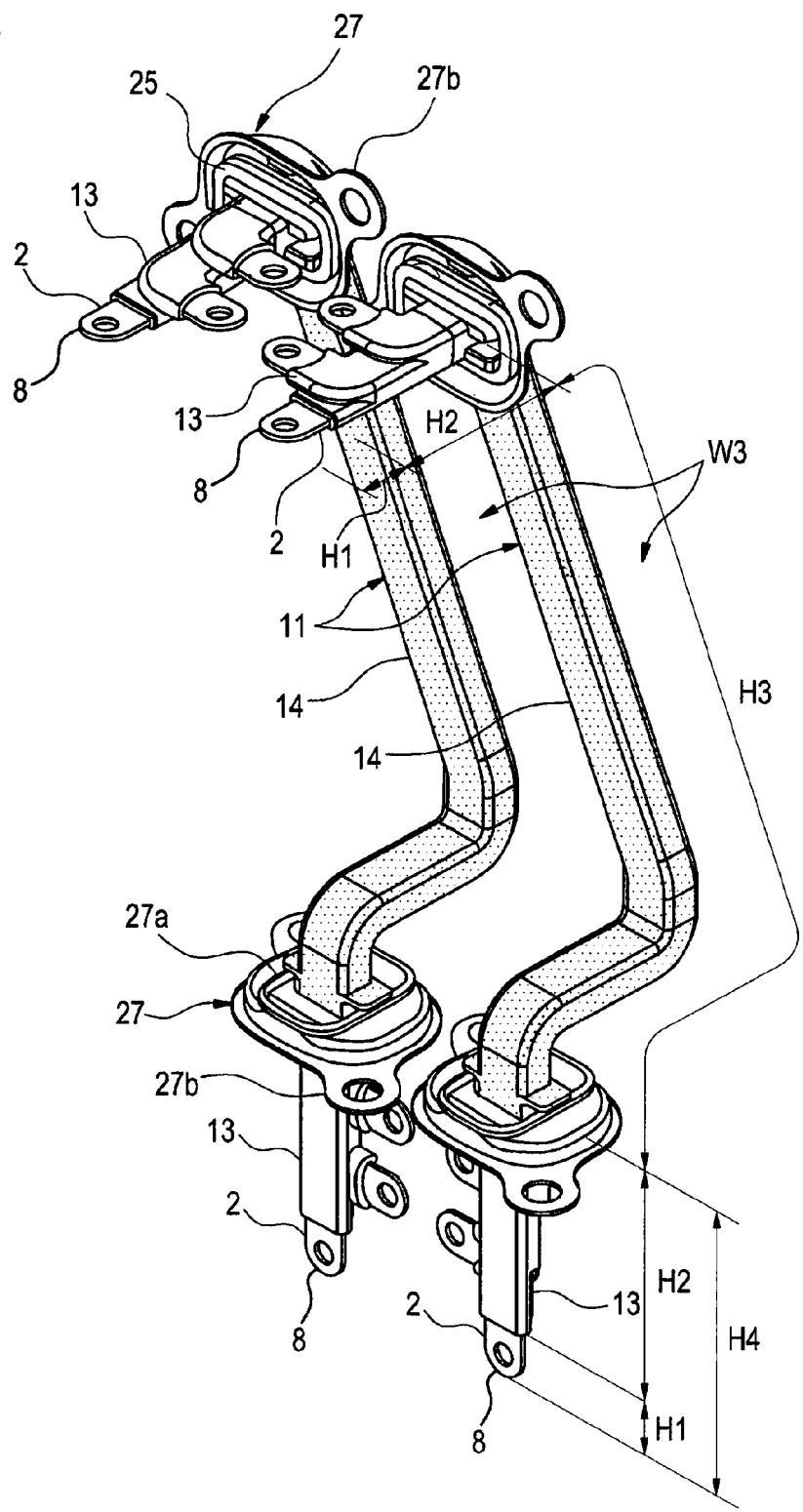
FIG. 5 is a perspective view of a shielding structure for a wire harness of a third embodiment of the invention.
Figure 6:
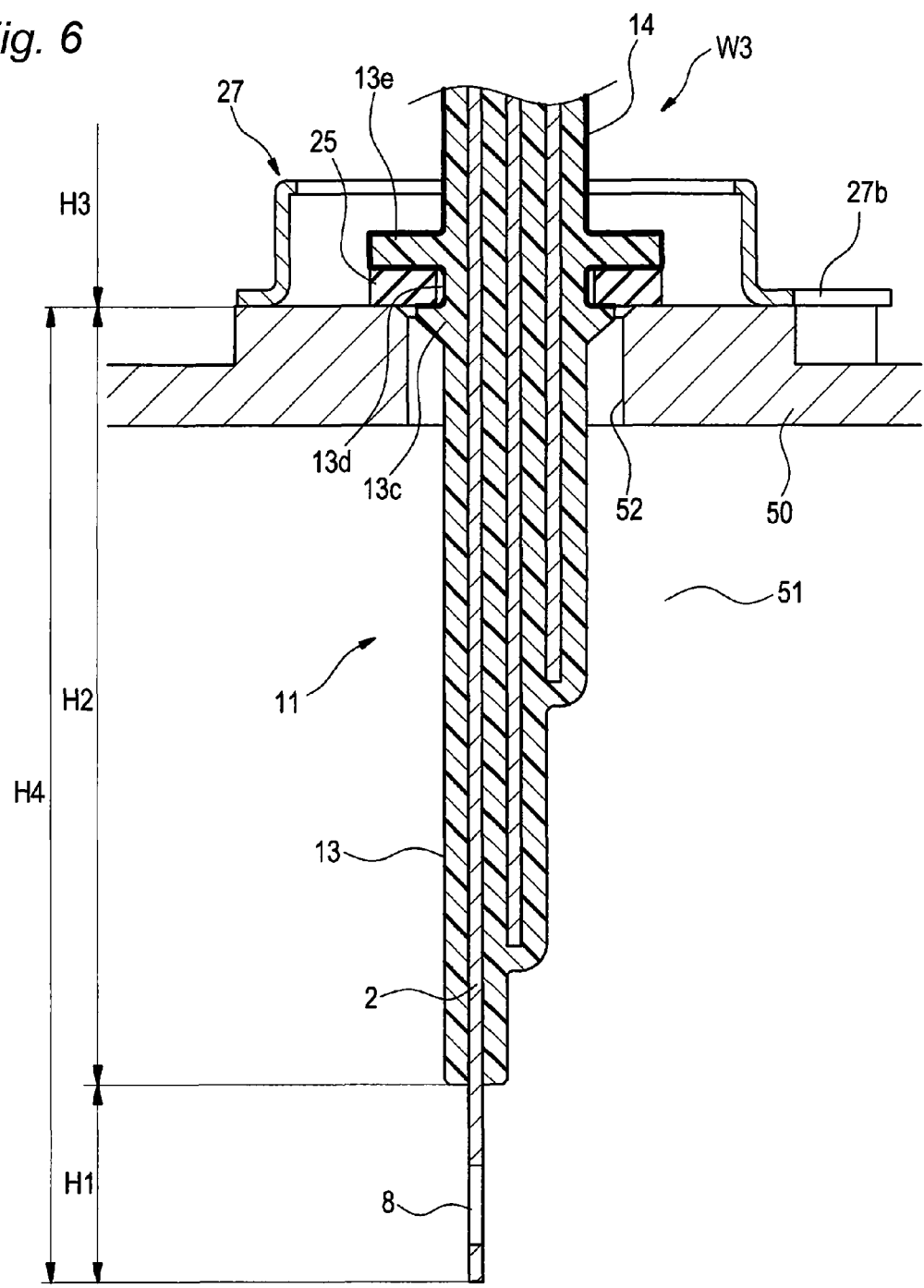
FIG. 6 is a sectional view of a portion where an end portion of the wire harness in the third embodiment is introduced into a shield case.

FIG. 5 is a perspective view of a shielding structure for a wire harness of a third embodiment of the invention, and FIG. 6 is a sectional view of a portion where an end portion of the wire harness is introduced into a shield case.

Each of wires 11 constituting the wire harness W3 of the third embodiment has a structure which is substantially identical with that of the second embodiment. A different point is that two protrusions 13c, 13e constituting a fitting groove 13d are disposed on the outer circumference of the resin mold portion 13 covering the terminal portion of the wire 11, and an inner circumferential portion of a ring-like seal member 25 is fitted into the fitting groove 13d. The seal member 25 is electrically conductive with the shield layer 14 on the surfaces of the two protrusions 13c, 13e.

A flange 13g which cooperates with the protrusion 13e to constitute an engaging groove 13h is disposed on the outer circumference of the resin mold portion 13, and a wire terminal-side movement regulating portion 31 is formed.

The wire terminal-side movement regulating portion 31 in the third embodiment is disposed on the outer circumference of the resin mold portion 13 which is integrally molded so as to cover the conductors 2 in the state where the conductors are insulated from each other. Alternatively, the wire terminal-side movement regulating portion may be disposed on the outer circumference of a resin mold portion which is molded separately from an insulating resin layer that covers the conductors 2 in a state where the conductors are insulated from each other, and which is externally fitted and fixed onto the insulating resin layer.

In a ring-like shield shell 27 having an outer circumferential flange 27b, a shell-side movement regulating portion 33 is configured by an extending portion 27e which is projected toward one surface of the outer circumferential flange 27b, and an inner circumferential flange 27a which is formed on the whole circumference of the hole edge of a through hole 27d. The height of the inner circumferential flange 27a substantially coincides with the width of the engaging groove 13h, and the shell-side movement regulating portion 33 can enter the wire terminal-side movement regulating portion 31.

When the wire terminal-side movement regulating portion 31 and the shell-side movement regulating portion 33 are relatively rotated about the axis in a state where the shield shell 27 is externally inserted onto the resin mold portion 13, the shell-side movement regulating portion 33 enters the engaging groove 13h of the resin mold portion 13, whereby they are engaged with each other at a predetermined relative rotation position, and relative movement of the resin mold portion 13 and the shield shell 27 in the axial direction is regulated.

Here, the relative rotation position means a range from a rotation position where relative rotation in one direction is started and the shell-side movement regulating portion 33 begins to enter the engaging groove 13h, to that immediately before the shell-side movement regulating portion 33 is disengaged from the engaging groove 13h.

In the embodiment, a rotation regulating mechanism 35 which regulates relative rotation of the resin mold portion 13 and the shield shell 27 is disposed between the wire terminal-side movement regulating portion 31 and the shell-side movement regulating portion 33.

Figure 7:
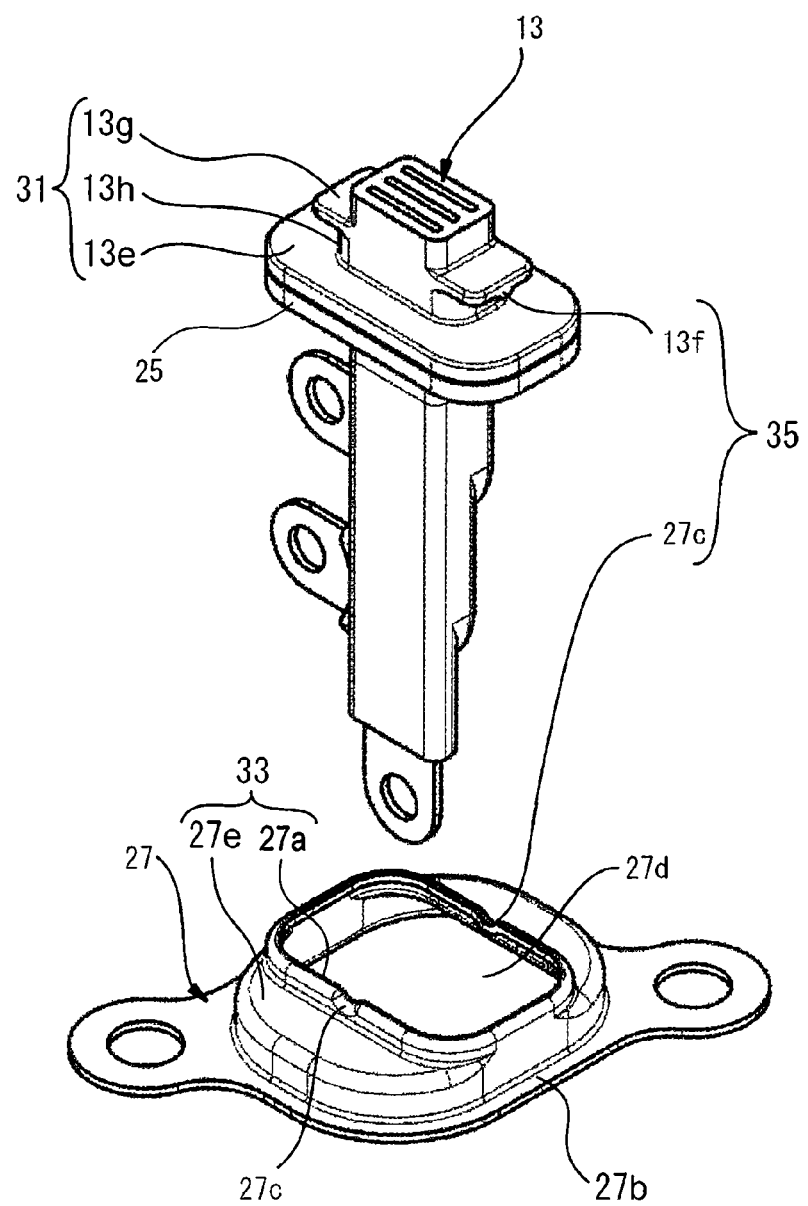
FIG. 7 is an exploded perspective view of a shield portion showing an assembling step in the third embodiment.

In the embodiment, as shown in FIG. 7, the rotation regulating mechanism 35 is configured by a convex portion 13f and a concave portion 27c. The convex portion 13f is disposed projectingly toward the engaging groove 13h on the flange 13g of the resin mold portion 13, and the concave portion 27c is disposed by cutting away the inner circumferential flange 27a of the shield shell 27. When the convex portion 13f and the concave portion 27c are elastically latched together, the relative rotation of the resin mold portion 13 and the shield shell 27 is cancellably regulated.

As described above, the inner circumferential flange 27a of the shield shell 27 is engaged in an adequate place with the resin mold portion 13, and the metal-made shield shell 27 is fixed to the shield wall 50 of the electric apparatus, whereby the seal member 25 can be made in close contact with the shield wall 50 while performing a sealing operation.

The other configuration is identical with that of the second embodiment, and similar effects can attained.

FIGS. 7 to 12 are views of assembly steps of the shield portion in the third embodiment. In the figures, the wire 11 is not illustrated.

Figure 8A:
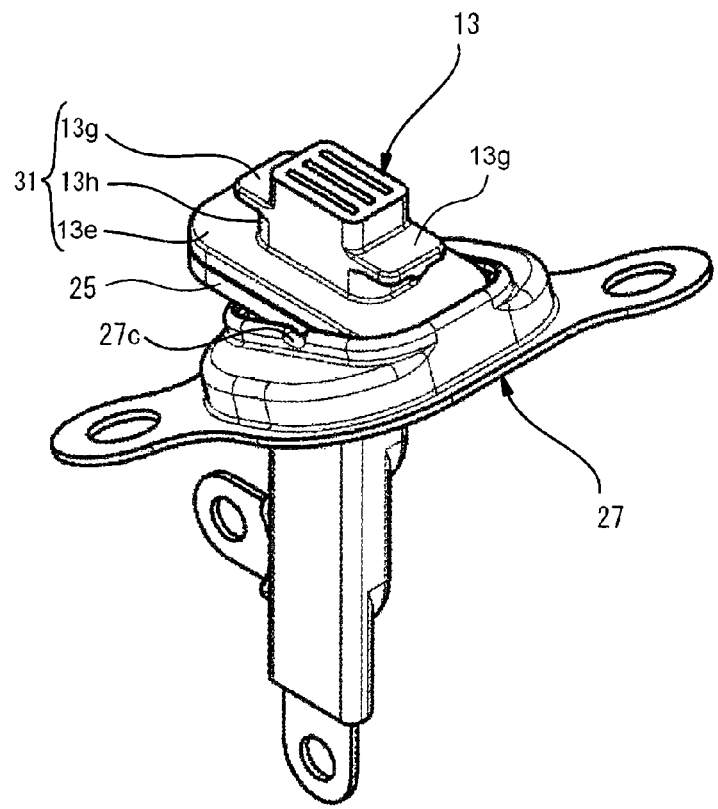
FIGS. 8A and 8B are views showing a step subsequent to FIG. 7.
Figure 8B:
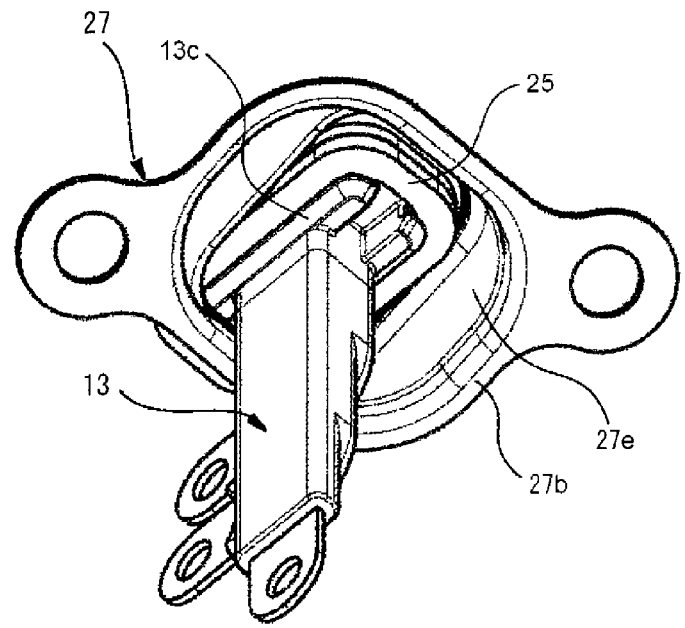
Figure 9A:
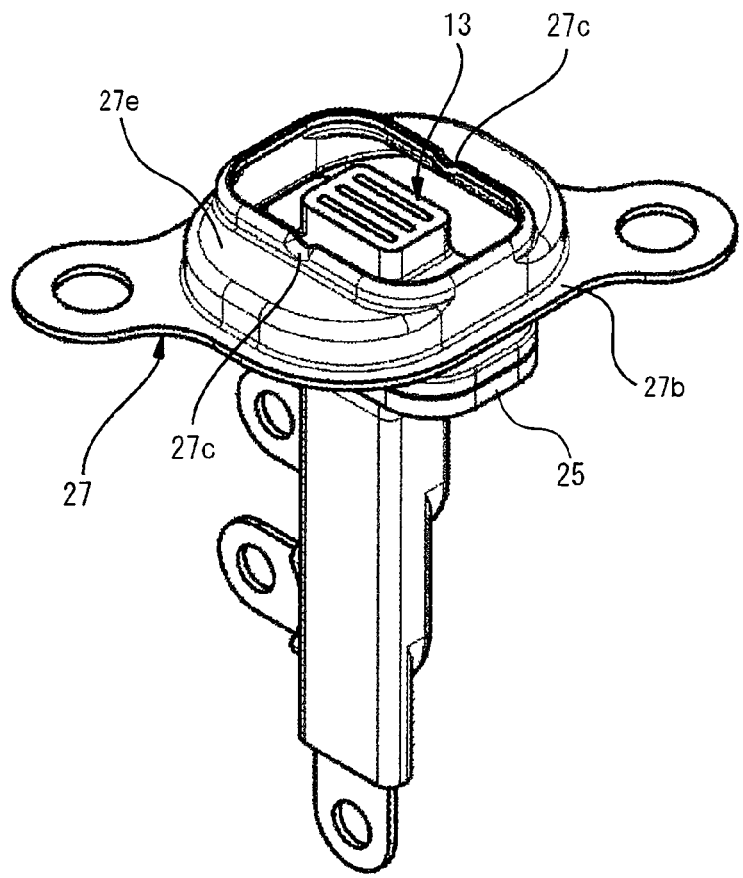
FIGS. 9A and 9B are views showing a step subsequent to FIGS. 8A and 8B.
Figure 9B:
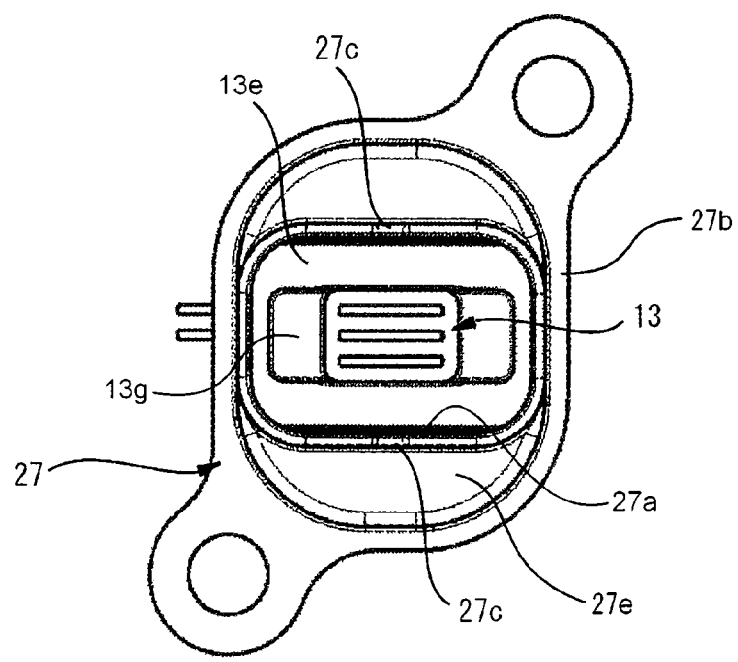

As shown in FIGS. 7 to 9B, first, the resin mold portion 13 to which the seal member 25 is attached is passed through the through hole 27d of the shield shell 27 from the side (in FIG. 7, the lower side) of the terminal portion of the wire 11. At this time, as shown in FIG. 8, one side of the protrusion 13e of the resin mold portion 13 is passed through the through hole 27d while the shield shell 27 is inclined, and the other side of the protrusion 13e is then passed, so that, as shown in FIG. 9, the seal member 25 and the protrusion 13e are completely passed through the through hole 27d.

Figure 10:
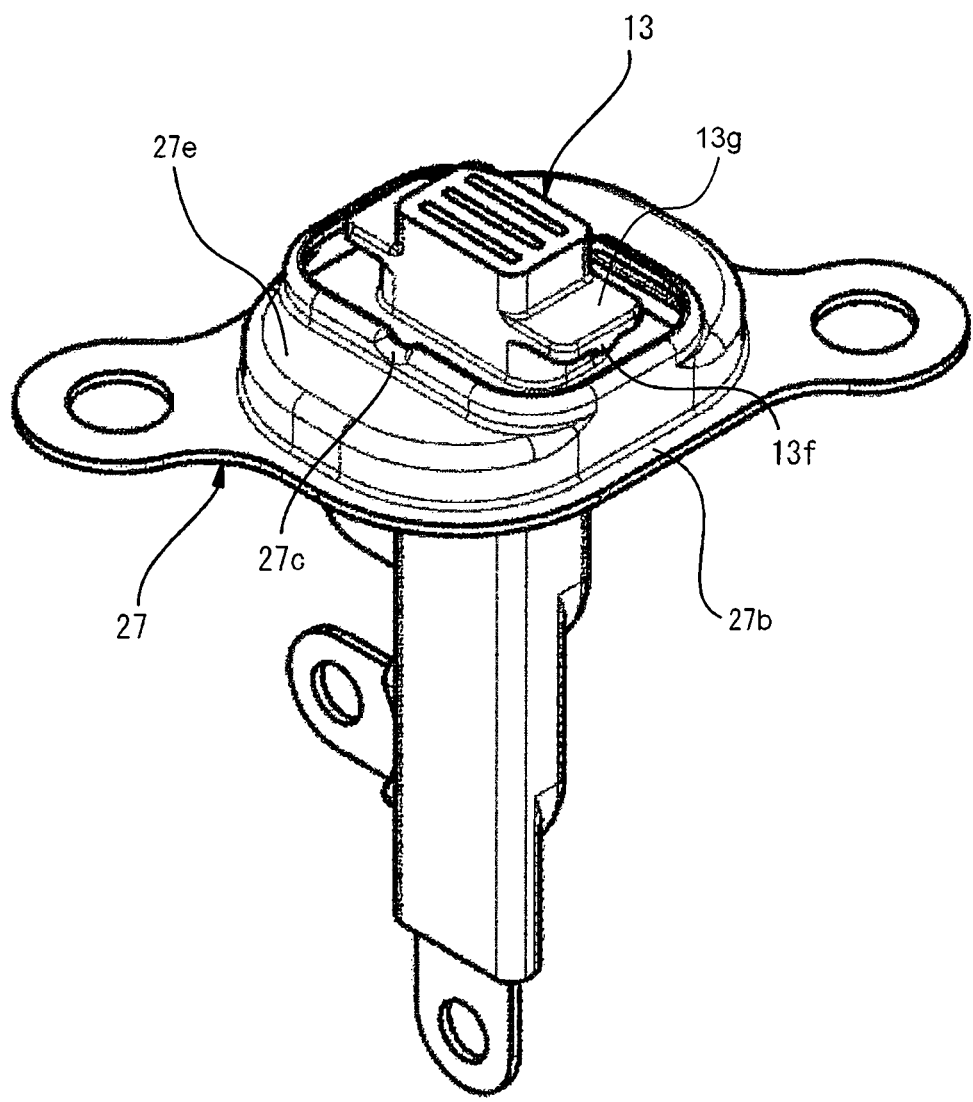
FIG. 10 is a perspective view showing a step subsequent to FIGS. 9A and 9B when the shield portion is viewed from the upper side.

As shown in FIG. 10, next, the resin mold portion 13 is slightly returned to the originating direction of the passing operation (in the figures, the upper direction), so that the flange 13g disposed in the resin mold portion 13 is pressingly contacted with an inlet portion of the through hole 27d of the shield shell 27 and able to be relatively swung about the axis.

Figure 11:
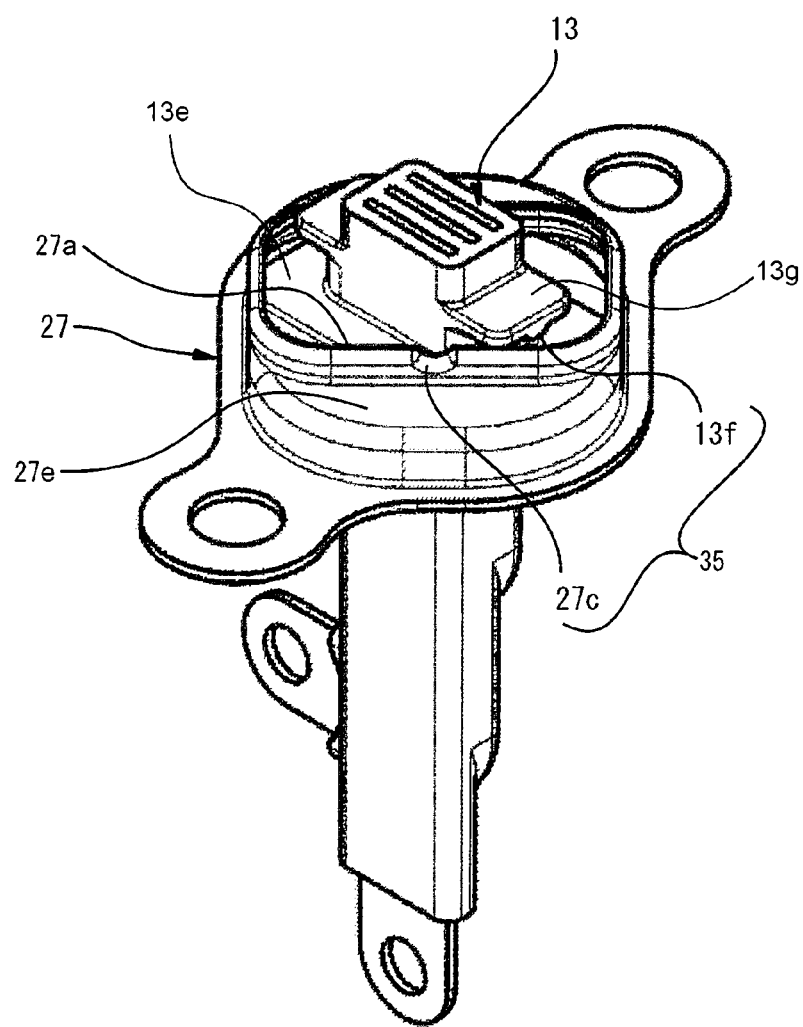
FIG. 11 is a perspective view showing a step subsequent to FIG. 10 when the shield portion is viewed from the upper side.
Figure 12:
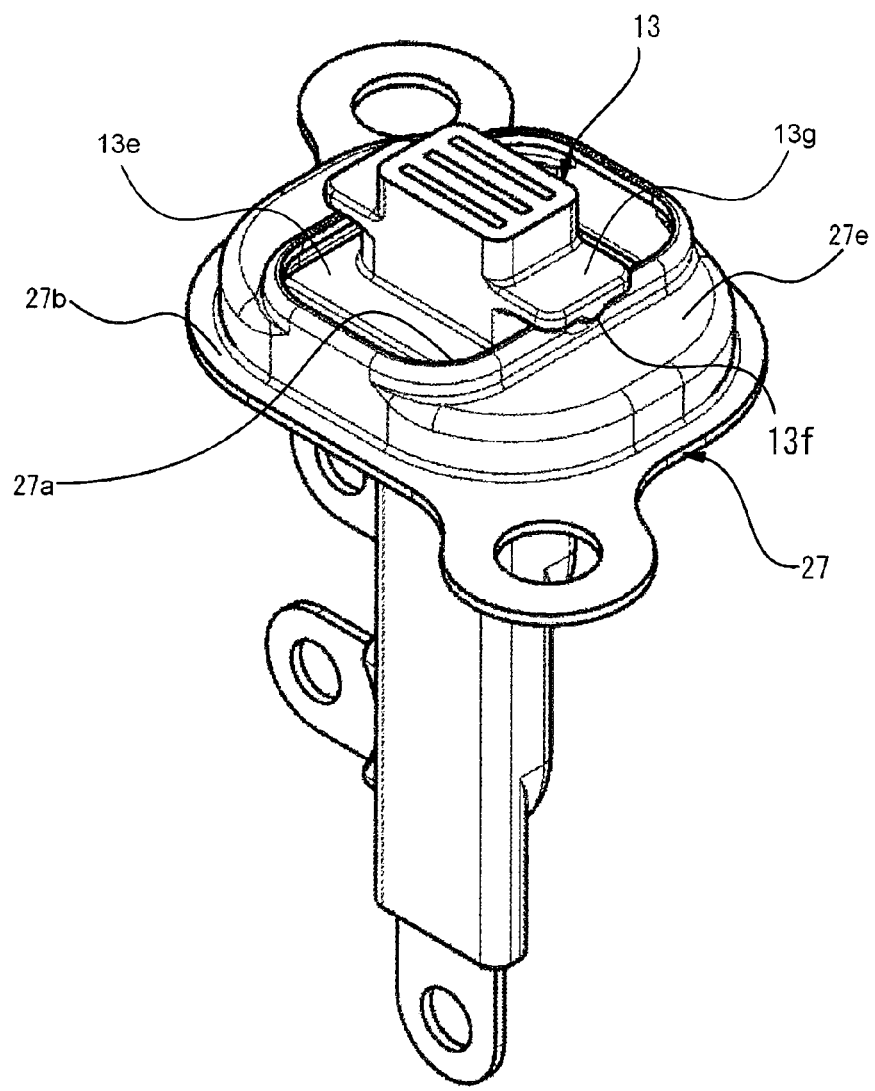
FIG. 12 is a perspective view showing a step subsequent to FIG. 11 when the shield portion is viewed from the upper side.
Figure 13:
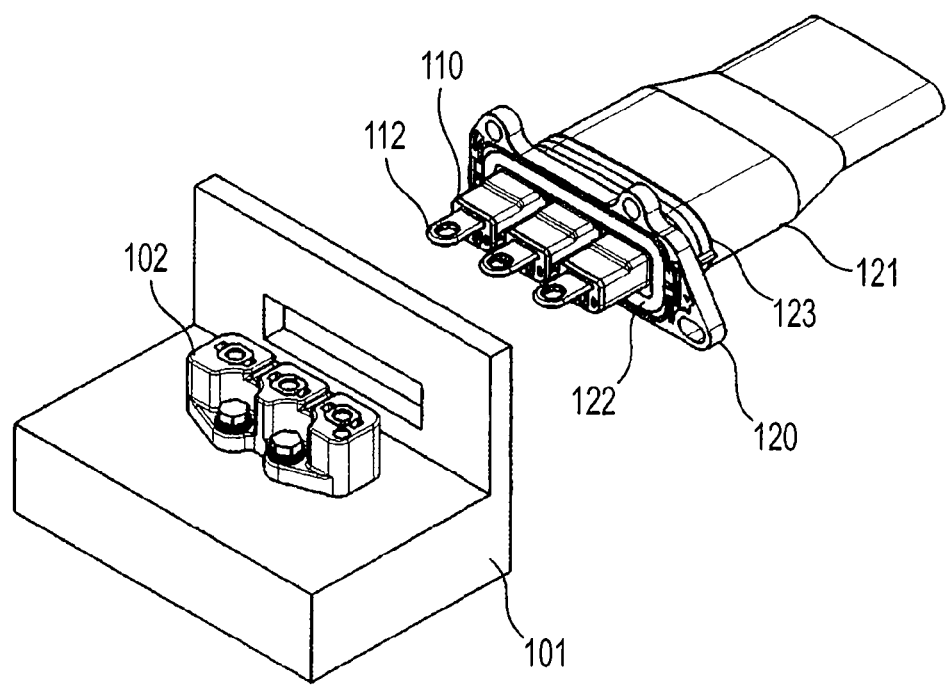
FIG. 13 is a perspective view of a conventional shielding structure for a wire harness before assembly.
Figure 14:
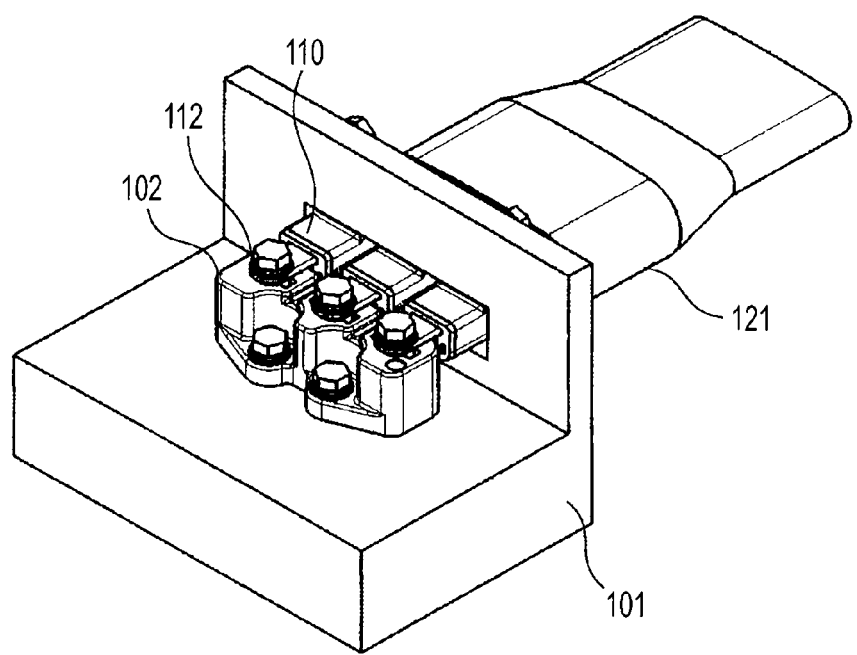
FIG. 14 is a perspective view of the shielding structure in an assembled state.
Figure 15:
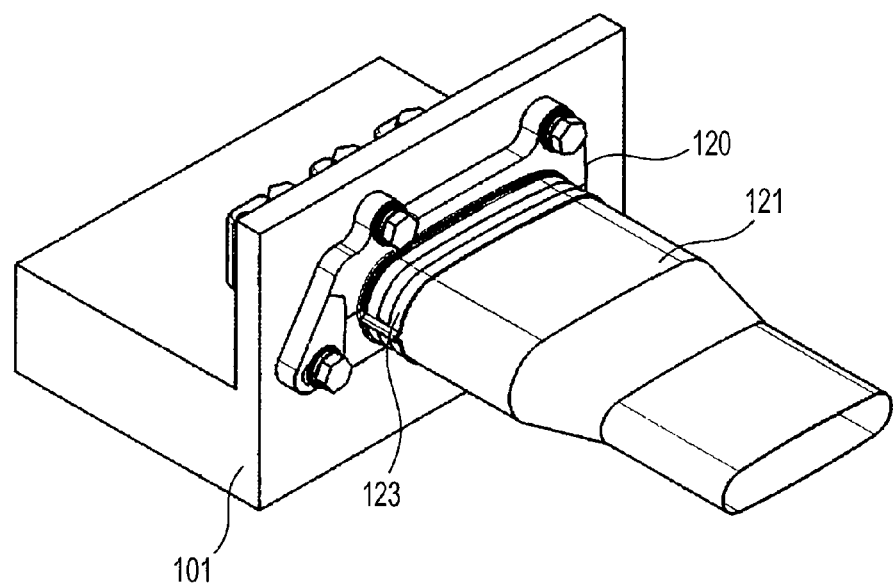
FIG. 15 is a perspective view of the shielding structure in an assembled state as viewed in another direction.

As shown in FIGS. 11 and 12, next, the shield shell 27 is swung by 90 degrees, and the wire terminal-side movement regulating portion 31 and the shell-side movement regulating portion 33 are engaged with each other, so that axial movements of the resin mold portion 13 and the shield shell 27 are regulated. Namely, the inner circumferential flange 27a and extending portion 27e of the shell-side movement regulating portion 33 enter the engaging groove 13h of the wire terminal-side movement regulating portion 31, and the resin mold portion 13 and the shield shell 27 become immovable in the axial direction to be fixed.

At this time, the relative rotation of the resin mold portion 13 and the shield shell 27 is regulated by the rotation regulating mechanism 35 which is disposed between the wire terminal-side movement regulating portion 31 and the shell-side movement regulating portion 33. The rotation regulation due to the rotation regulating mechanism 35 is performed by causing the concave portion 27c disposed in the shield shell 27 to be engaged with the convex portion 13f disposed on the flange 13g as shown in FIG. 12. Therefore, the resin mold portion 13 and the shield shell 27 are held to the integrally fixed state where axial movement and relative rotation about the axis are regulated, and the fixed state is prevented from being accidentally cancelled. In this way, the shield shell 27 is attached to the resin mold portion 13.

When the integrally fixed state of the resin mold portion 13 and the shield shell 27 is to be cancelled, a rotational moment of a certain level or higher may be applied against the engagement force of the rotation regulating mechanism 35, and the resin mold portion 13 and the shield shell 27 may be relatively rotated until the engagement of the wire terminal-side movement regulating portion 31 and the shell-side movement regulating portion 33 is cancelled.

The invention is not limited to the above-described embodiments, and may be adequately subjected to modifications, improvements, and the like. In addition, the materials, shapes, dimensions, numbers, places, and the like of the components of the above-described embodiments are arbitrary and not limited insofar as the invention is achieved.

For example, a wire to be connected may not be a flat wire (flat cable) as in the embodiments, and may be a usual wire having a circular sectional shape.

The connecting portion may have a configuration where a separate connection terminal is connected and fixed to the tip end of the conductor by crimping, welding, or the like.

The application is based on Japanese Patent Application No. 2010-290407 filed Dec. 27, 2010 and Japanese Patent Application No. 2011-254136 filed Nov. 21, 2011, and their disclosure is incorporated herein by reference.

INDUSTRIAL APPLICABILITY

According to the shielding structure for a wire harness of the invention, employment of a shield layer formed by resin plating on the outer circumference of a wire and a seal member made of electrically conductive rubber enables the number of components to be reduced while ensuring sufficient sealing and shielding performances. Even in a situation where a wire is branched along the way, the structure can easily cope with the situation. Furthermore, it is possible eliminate the process cumbersome and problem in space which may be caused when a braid is used.

According to the shell fixture structure of the invention, it is not required to previously pass a shield shell with respect to a wire harness, and hence the workability can be improved.

REFERENCE SIGNS LIST

W1 to W3 wire harness
1, 11 wire
2 conductor
3 insulating resin layer
4 shield layer
5 seal member
5a wire passing hole
8 connecting portion
13 resin mold portion
15 seal member
25 seal member
50 shield wall
H1 conductor exposed range (conductor exposed portion)
H3 resin plating range (shield layer)
H4 non-resin plating portion

The invention claimed is:

1. A shielding structure for a wire harness in which a wire constituting a wire harness is to be introduced into a shield wall of an electric apparatus while being shielded, comprising:
a seal member which is made of electrically conductive rubber, which has a wire through hole that allows the wire to pass therethrough while sealing a circumference of the wire, and which is to be attached to the shield wall in a closely contacted state, wherein
the wire has a structure where an insulating resin layer is formed on an outer circumference of a conductor, and a predetermined range in a length direction of the conductor is coated with a shield layer formed by resin plating to cover an outer circumferential surface of the insulating resin layer,
a terminal portion of the wire is passed through the wire though hole of the seal member to be introduced into the shield wall to a position where the shield layer formed by the resin plating exists, whereby an inner circumference of the wire though hole of the seal member is made in close contact with the shield layer of the wire to cause the shield layer and the seal member made of electrically conductive rubber to be electrically conducted with each other,
in the terminal portion of the wire introduced into the shield wall, a non-resin plating portion where the resin plating is excluded in a predetermined range from an end portion of the conductor is ensured,
a conductor exposed portion in which the insulating resin layer is excluded is disposed in an end portion of the non-resin plating portion, and
a connecting portion is disposed in the conductor exposed portion.

2. A shielding structure for a wire harness in which a wire constituting a wire harness is to be introduced into a shield wall of an electric apparatus while being shielded, comprising:
a seal member which is made of electrically conductive rubber, which has a wire through hole that allows the wire to pass therethrough while sealing a circumference of the wire, and which is to be attached to the shield wall in a closely contacted state, wherein
the wire has a structure where an insulating resin layer is formed on an outer circumference of a conductor, and a predetermined range in a length direction of the conductor is coated with a shield layer formed by resin plating to cover an outer circumferential surface of the insulating resin layer,
a terminal portion of the wire is passed through the wire through hole of the seal member to be introduced into the shield wall to a position where the shield layer formed by the resin plating exists, whereby an inner circumference of the wire through hole of the seal member is made in close contact with the shield layer of the wire to cause the shield layer and the seal member made of electrically conductive rubber to be electrically conducted with each other,
a plurality of the conductors are covered in a state where the conductors are insulated from each other, by a resin mold portion which is integrally molded, and which functions as the insulating resin layer,
a predetermined range in a length direction of the conductors is coated with a shield layer formed by the resin plating to cover an outer circumferential surface of the resin mold portion,
the wire through hole that allows the resin mold portion to pass therethrough while sealing a circumference of the resin mold portion that integrally holds the plurality of conductors is disposed in the seal member, and
terminal portions of the conductors which are held by the resin mold portion are passed through the wire through hole of the seal member to be introduced into the shield wall to a position where the shield layer formed by the resin plating exists, whereby the inner circumference of the wire through hole of the seal member is made in close contact with the shield layer which covers the outer circumferential surface of the resin mold portion, and the shield layer and the seal member made of electrically conductive rubber are electrically conducted with each other.

* * * * *